United States Patent
Ganguli et al.

(10) Patent No.: US 7,476,474 B2
(45) Date of Patent: *Jan. 13, 2009

(54) METHOD FOR MAKING A PHOTOMASK ASSEMBLY INCORPORATING A POROUS FRAME

(75) Inventors: Rahul Ganguli, Agoura Hills, CA (US); Troy Robinson, Camarillo, CA (US); D. Laurence Meixner, Camarillo, CA (US)

(73) Assignee: Yazaki Corporation (JP)

( * ) Notice: Subject to any disclaimer, the term of this patent is extended or adjusted under 35 U.S.C. 154(b) by 325 days.

This patent is subject to a terminal disclaimer.

(21) Appl. No.: 11/340,384

(22) Filed: Jan. 25, 2006

(65) Prior Publication Data

US 2006/0141371 A1    Jun. 29, 2006

Related U.S. Application Data

(62) Division of application No. 10/646,356, filed on Aug. 22, 2003, now Pat. No. 7,014,961.

(51) Int. Cl.
G03F 1/14        (2006.01)
B29C 65/00     (2006.01)
B32B 37/00     (2006.01)
B32B 38/10     (2006.01)
C03B 8/00       (2006.01)
C03B 23/20    (2006.01)
C03C 19/00    (2006.01)
C03C 27/06    (2006.01)

(52) U.S. Cl. ............................ 430/5; 156/107; 156/153; 65/17.2; 65/36; 65/61

(58) Field of Classification Search ........................ 430/5
See application file for complete search history.

(56) References Cited

U.S. PATENT DOCUMENTS 4,833,051 A    5/1989    Imamura (Continued)

FOREIGN PATENT DOCUMENTS

JP         03-166545         7/1991

(Continued)

OTHER PUBLICATIONS

Kikugawa, S., Okada, K., Mishiro, H. and Sasuga, T., "Current Status of Hard Pellicle Development," *Asahi Glass Co., Ltd.*, Dec. 10, 2001, pp. 1-14.

(Continued)

*Primary Examiner*—Mark F Huff
*Assistant Examiner*—John Ruggles
(74) *Attorney, Agent, or Firm*—Sheppard, Mullin, Richter & Hampton LLP

(57) ABSTRACT

A photomask assembly is described having a frame for supporting a transparent pellicle above a photomask substrate, defining a closed pellicle space overlaying the substrate. The frame is formed of a porous material configured to allow the pellicle space to be purged with an inert gas within a reasonable processing time period, thereby removing any harmful chemicals that might be present. The frame preferably is made by a method that includes preparing a gel by a sol-gel process, drying the gel, and partially densifying the dry gel. The resulting frame has a gas permeability to oxygen or nitrogen higher than about 10 ml.mm/cm².min.MPa, an average pore size between 0.001 micrometer and 10 micrometers, and a coefficient of thermal expansion between 0.01 ppm/° C. and 10 ppm/° C.

31 Claims, 5 Drawing Sheets

U.S. PATENT DOCUMENTS

| | | | |
|---|---|---|---|
| 5,101,420 A * | 3/1992 | Kushibiki et al. | 430/5 |
| 5,344,677 A | 9/1994 | Hong | |
| 5,529,819 A | 6/1996 | Campi, Jr. | |
| 5,814,381 A | 9/1998 | Kuo | |
| 6,099,792 A | 8/2000 | Ganguli et al. | |
| 6,507,390 B1 * | 1/2003 | Ivaldi | 355/75 |
| 6,524,754 B2 | 2/2003 | Eynon | |
| 6,593,034 B1 | 7/2003 | Shirasaki | |
| 7,043,940 B2 * | 5/2006 | Ganguli | 65/17.2 |
| 2003/0035222 A1 * | 2/2003 | Okada et al. | 359/629 |
| 2004/0028269 A1 | 2/2004 | Yamabe et al. | |
| 2006/0246234 A1 * | 11/2006 | Meyers et al. | 430/5 |

FOREIGN PATENT DOCUMENTS

| | | |
|---|---|---|
| JP | 04-196117 | 7/1992 |
| WO | WO 01/59522 | 8/2001 |

OTHER PUBLICATIONS

Laganza, Joseph, "157nm Reticle Handling Technology," *Sematech TDR*, Dec. 12, 2001, pp. 1-20.

Cullins, Jerry, "LITJ360-157nm Mask Materials," International Sematech 157nm Technical Data Review, Dec. 2001, pp. 1-4.

"Hard Pellicle Overview," International Sematech, Feb. 4, 2002, pp. 1-6.

"157nm Blank Status," International Sematch, Feb. 4, 2002, pp. 1-3.

"Purging," International Sematech, Feb. 4, 2002, pp. 1-11.

"157nm Cleaning/Handling," International Sematech, Feb. 4, 2002, pp. 1-7.

Ganguli, Rahul et al., "Sol-gel fabrication of high quality photomask substrates," Proceedings of SPIE, vol. 4889, Oct. 1, 2002, pp. 32-39.

Meixner, D. Laurence, et al, "*Porous silica* frame for deep UV lithography," Proceedings of SPIE, vol. 4889, Oct. 3, 2002, pp. 450-456.

Bhattacharyya, Kaustuve, et al., "Investigation of reticle defect formation at DUV lithography," Photomask, Feb. 2003, vol. 19, Issue 2, 7 pages.

Meixner, D. Laurence, "*Porous silica* frame for deep UV lithography," Proceedings of SPIE, vol. 5040, Feb. 25, 2003, pp. 1018-1024.

Jeng, De-Yin, et al., " *Porous silica* Pellicle Frame," Proceedings of SPIE, vol. 5256, Sep. 9, 2003, pp. 213-221.

* cited by examiner

METHOD FOR MAKING A PHOTOMASK ASSEMBLY INCORPORATING A POROUS FRAME

CROSS-REFERENCE TO RELATED APPLICATIONS

This is a division of U.S. patent application Ser. No. 10/646,356, filed Aug. 22, 2003, now U.S. Pat. No. 7,014,961, which issued on Mar. 21, 2006, which is hereby incorporated by reference as if fully set forth herein.

BACKGROUND OF THE INVENTION

This invention relates generally to photomask assemblies used in a lithographic process and, more particularly, to photomask assemblies incorporating porous frames, such frames being configured to facilitate purging of the space adjacent to the photomask substrate. This invention also relates to methods for making such photomask assemblies.

In the semiconductor industry, intricate patterns of electronic chips are generally made using photolithographic processes. These processes utilize photomask assemblies, in combination with laser exposure systems, to transfer patterns onto electronic chips. FIG. 1 shows the components of a conventional photomask assembly 10, including a pellicle 12, a frame 14, antireflective films 16, a liquid coating 18, a photomask substrate 20, mounting adhesive 22, a cover adhesive 24, glue 26, and a release liner 28.

The photomask substrate 20 typically is made of synthetic silica and is printed with a pattern of an electronic circuit or chip (not shown in FIG. 1) to be produced. The pellicle 12 typically is made of a soft transparent polymer, and it functions to protect the patterned surface of the photomask substrate from outside contaminants, thereby extending the substrate's lifetime and decreasing the production costs of the electronic chips. Both surfaces of the pellicle are coated with antireflective films 16, to increase the transmittance of the laser light. The frame 14 typically is made of anodized aluminum, and it functions to support the polymer pellicle above the substrate so as to define a pellicle space 32. The frame typically has a rectangular shape, although it alternatively can have a polygonal, oval, or circular shape. The frame and pellicle typically are mounted on the photomask substrate using any of a variety of adhesives. The release liner 28 typically is made of a polymer material, and it functions to facilitate an easy removal of the pellicle, to allow various components of the assembly to be cleaned or replaced. The liquid coating 18 is applied to the inner surface of the frame, to capture particulate matter present in the pellicle space 32.

The pattern on the photomask substrate 20 is repetitively transferred onto the surface of a succession of electronic chips (not shown in FIG. 1) by continuously exposing the photomask substrate to light of a specified wavelength. Conventional photolithography systems use laser light sources operating at wavelengths of 436 nm, 365 nm, 248 nm, and more recently 193 nm. In general, lower wavelengths provide a finer pattern resolution. It is expected that 157 nm lasers will be used in the future to develop even finer patterns.

The exposure to light from high energy lasers operating at such ultraviolet (UV) and deep-ultraviolet (DUV) wavelengths can heat the assembly and trigger certain undesired photochemical and thermal reactions. These reactions can cause defects to form and grow on the surfaces of the components of the photomask assembly, eventually destroying the patterns transferred to the chips.

The formation and growth mechanisms resulting from the undesired photochemical and thermal reactions identified above are described in a publication by Bhattacharyya et al., entitled "Investigation of Reticle Defect Formation at DUV Lithography," BACUS News, February 2003, Vol. 19 (2). These mechanisms are affected by several factors, including the photomask assembly components described above, the assembly container, the storage and fabrication environment, the exposure system environment, residuals from the cleaning of the assembly components, repetitive exposure to the laser light, and the wavelength of the laser. The Bhattacharyya et al. publication reports that outgassing of ammonia from the frame adhesive is responsible for forming defects at 248 nm exposure. It also reports that the number of defects increases considerably after the $700^{th}$ exposure to a 193 nm laser. These defects might form due to the presence of water vapor, ammonia, carbon dioxide, and sulfuric acid, which either have diffused into the pellicle space from the outside environment and/or have been formed by degassing or degradation of the assembly components. It is believed that oxygen present in the exposure environment also can cause defects to be formed. In addition, oxygen and water vapor can absorb the laser light at 193 nm, thereby decreasing the light transmittance. Volatile hydrocarbons also can contribute to the formation of defects and to a decrease in transmittance, by absorbing the laser light. Such problems are expected to increase with the future use of higher energy, 157 nm photolithography systems.

The formation of defects can be partially or completely avoided by purging the pellicle space with an inert gas such as nitrogen after the assembly has been fabricated and/or during the laser exposure. This purging removes the harmful chemicals mentioned above. As explained in a publication by Cullins, entitled "LITJ360-157 nm Mask Materials," *International SEMATECH's 157 nm Technical Data Review*, December 2001, some incidental purging may occur through the pellicle itself, because the pellicle is formed of a polymer material having some permeability. However, this purging is thought to be too slow to eliminate all the problems discussed above within a reasonable processing time. Also, it is known that the soft polymer pellicles can easily degrade when repetitively exposed to light from UV and DUV lasers, causing considerable reduction in light transmittance, particularly at 157 nm. In addition, soft polymer pellicles cannot easily be cleaned and handled. U.S. Pat. No. 6,524,754 to Eynon suggests that hard pellicles formed of synthetic or fused silica can be substituted for the soft polymer pellicles. Although such hard pellicles can solve the cleaning, handling, and degradation problems, they are impermeable to gases and thereby not suitable for purging through the pellicle.

Conventional photomask assemblies incorporate frames made of anodized aluminum, which have the following significant disadvantages. First, because the aluminum frame is generally impermeable to most gases, the pellicle space cannot be purged through the frame.

Second, there is a considerable mismatch between the coefficient of thermal expansion (CTE) of the aluminum frame and that of the photomask substrate. The high purity synthetic silica widely used in manufacturing of photomask substrates for conventional lithography has a CTE of about 0.55 ppm/° C., which is significantly lower than that of the aluminum frame, about 25 ppm/° C. Fluorinated synthetic silica is considered to be a material of choice for manufacturing of photomask substrates for DUV, particularly for 157 nm lithography. The CTE of the fluorinated silica is affected by the level of fluorine doping. For example, silica articles doped with about 8,000 ppm and about 15,000 ppm fluorine have CTEs of about 0.51 ppm/° C. and about 0.43 ppm/° C. respectively. The hard pellicles also made of silica or fluorinated silica have CTEs similar to those of the photomask substrate. The generation of heat during the manufacturing of the electronic chips causes the temperature of the photomask assembly to increase above the room temperature. Because of the large CTE mismatch between the frame and the substrate, this heating generates significant stresses in the assembly. As a result, the printed area can be distorted, degrading the image transferred on the chip. Also, the pellicle can bend unacceptably, further aggravating the image degradation. These problems become more acute when DUV photolithography wavelengths, such as 193 nm and 157 nm, are used. As reported by Kikugawa et al., in a publication entitled "Current Status of Hard Pellicle Development," *International SEMATECH's 157 nm Technical Data Review* (December 2001), the bending of the hard pellicle was intolerable, around 50 micrometers, when the assembly is heated only from 21.6° C. to 26° C.

Third, aluminum frames cannot be machined to better than about a 20-micrometer surface flatness. The sharpness of the image transferred onto the chip highly depends on the optical alignment of the pellicle film with respect to the substrate. Any misalignment causes optical distortions resulting in patterns with bad quality. This is especially a very acute problem for 157-nm lithography. It is therefore preferable to have a frame which is made of a material suitable for grinding and polishing to obtain surface flatness levels better than 20 micrometers.

Another problem encountered by conventional photomask assemblies results from pressure gradients that can arise between the pellicle space and the assembly's exterior, e.g., during shipment of the assemblies using aircraft, exposing the assemblies to varying pressures. U.S. Pat. No. 4,833,051 to Imamura, U.S. Pat. No. 5,529,819 to Campi, U.S. Pat. No. 5,344,677 to Hong, and U.S. Pat. No. 5,814,381 to Kuo disclose photomask assemblies incorporating vent structures for overcoming this problem by equalizing pressure between the pellicle space and the assembly's exterior. These vent structures, or channels, are constructed by forming channels having sizes in the range of 50 micrometers to 2,000 micrometers. These channels penetrate through the frame and/or the adhesive layers used in mounting the frame to the photomask assembly. The channels cannot by themselves prevent the diffusion of particles smaller than 10 micrometers into the pellicle space from the assembly's exterior, so the channels take the form of tortuous, zigzag-shaped structures, to trap the particles. The installing of filter systems in the channels and/or applying adhesive coatings onto walls of the channels also are disclosed for preventing the diffusion of particles.

The frames disclosed in the Campi, Hong, and Kuo patents are made of aluminum, stainless steel, or like which have higher CTEs than that of the photomask substrate and/or the hard pellicle and, therefore, cannot prevent the image degradation problems described above. Furthermore, the use of tortuous vent structures, filters, and/or adhesives, mentioned above, are considered to unduly complicate the construction of photomask assemblies.

U.S. Pat. No. 6,593,034 to Shirasaki describes an aluminum, stainless steel, or polyethylene frame having a vent structure for use in purging the pellicle space with nitrogen to prevent the absorption of the laser light by oxygen. The vent structure has 500-micrometer holes penetrating through the frame body, so it incorporates a filter system to prevent diffusion of particles smaller than 10 micrometers. The frames described in Shirasaki patent have CTEs higher than that of the photomask substrate and/or the hard pellicle, and it, therefore, cannot prevent the image degradation problems described above. In addition, the need for a vent structure in the frame body and the need for a filter system are considered to unduly complicate the construction of photomask assemblies. Furthermore, frames made of metals such as aluminum, stainless steel, or the like, generally are not suitable for cleaning by aggressive cleaning agents such as acids to remove contaminants, without producing corrosion-inducing metallic contaminants.

A frame suitable for purging photomask assemblies incorporating hard pellicles is described in a publication by Cullins entitled "LITJ360-157 nm Mask Materials," *International SEMATECH's 157 nm Technical Data Review* (December 2001). The disclosed frame includes six holes covered with Gortex® filters. The material of the frame and the CTE of the frame, and the sizes of the holes, are not disclosed. The need for filters is considered to unduly complicate manufacturing of the assembly. In addition, the presence of the filters can cause contamination due to outgassing both from the filters themselves and also from adhesives used for mounting the filters.

S. Kikugawa et al. report on the preparation of synthetic silica frames in "Current Status of Hard Pellicle Development," *International SEMA TECH's 157 nm Technical Data Review* (December 2001). The publication shows that silica frames can be machined to a surface flatness level of less than 1 micrometer it also shows that a hard pellicle mounted on a synthetic silica frame will bend by only 0.8 micrometer when the assembly is heated from 21.6° C. to 26° C. In contrast, a hard pellicle mounted on an anodized aluminum frame will bend by as much as 50 micrometers when heated over such a temperature range. This result indicates that the CTE of the synthetic silica frame closely matches that of the photomask substrate and the hard pellicle. This silica frame has multiple holes, which are reported to be 1,200 micrometers in diameter, to allow purging the pellicle space with nitrogen. Since a single particle smaller than 10 micrometers in size entering the pellicle can render the entire produced photomask useless, this multi-hole fused silica frames are covered with filters to prevent particle contamination. However, the need for filters complicates manufacturing of the assembly and can cause contamination due to outgassing from the filters and also from adhesives used for mounting the filters. Furthermore, since the inner surface area of such frames is very low, the frame's scavenging capability of the volatile contaminants is considered to be only minimal.

It should be apparent that there exists a need for a photomask assembly incorporating a frame made of a porous material having sufficient permeability to allow for acceptable purging rates, pore sizes smaller than 10 micrometers to prevent particles from entering the pellicle space, and sufficient capability to scavenge contaminants, while possessing a CTE compatible with the photomask substrate and/or the pellicle. The present invention fulfills these needs and provides further related advantages.

SUMMARY OF THE INVENTION

The present invention is embodied in a photomask assembly incorporating a porous frame, and in a method for making it, wherein the porous frame has a gas permeability to oxygen or nitrogen higher than about 10 ml.mm/cm$^2$.min.MPa, an average pore size between 0.001 micrometer and 10 micrometers, and a coefficient of thermal expansion between 0.01 ppm/° C. and 10 ppm/° C.

In more detailed features of the invention, the gas permeability of the porous frame to oxygen or nitrogen more preferably is higher than about 40 ml.mm/cm$^2$.min.Mpa, and most preferably is higher than about 70 ml.mm/cm$^2$.min.MPa.

Further, the average pore size of the porous frame more preferably is between 0.01 micrometer and 1 micrometer, and most preferably is between 0.08 micrometer and 1 micrometer. Further, the coefficient of thermal expansion of the porous frame is more preferably between 0.1 ppm/° C. and 1 ppm/° C., and most preferably is between 0.3 ppm/° C. and 0.7 ppm/° C. In addition, the frame's coefficient of thermal expansion preferably matches that of the photomask substrate and/or the hard pellicle to which the frame is attached within ±20%.

In other more detailed features of the invention, the surface flatness of the porous frame preferably is less than about 20 micrometers, more preferably is less than about 5 micrometers, and most preferably is less than about 1 micrometer. Further, the pore surface area of the porous frame preferably is larger than 10 m$^2$/g, more preferably is larger than 25 m$^2$/g, and most preferably is larger than 70 m$^2$/g. Further, the elastic modulus of the porous frame preferably is higher than 1 GPa, more preferably is higher than 5 GPa, and most preferably is higher than 10 GPa. Further, the frame's modulus of rupture preferably is higher than 1 MPa, more preferably is higher than 5 MPa, and most preferably is higher than 10 MPa.

In addition, the porous frame preferably is configured to scavenge harmful chemicals in an amount higher than 0.01 weight percent, and more preferably higher than 0.05 weight percent, of the material of the frame. The porous frame preferably is formed of a material selected from the group consisting of silica, fluorinated silica, $ZrO_2$, $Al_2O_3$, $SiO_2$—$Al_2O_3$, $SiO_2$—$B_2O_3$ and mixtures thereof, and most preferably is formed of a material selected from the group consisting of silica and fluorinated silica having a purity of greater than about 96 weight percent silica.

In accordance with the method of the invention, the porous frame is made by preparing a gel by a sol-gel process, drying the gel, and partially densifying the dry gel. The dry gel preferably comprises silica, and it is prepared using silicon alkoxide and fumed silica.

In optional, additional features, the method further can include machining the densified dry gel to form the frame. This machining can be accomplished by diamond tool machining, ultrasonic milling, laser machining, or water jet machining. This machining either can machine the densified dry gel to form the final frame or can machine the densified dry gel to form rectangular bars that then are welded together to form the frame. The machining preferably machines the densified dry gel to less than 20-micrometer surface flatness. Alternatively, the gel can be initially prepared in a mold dimensioned such that, when the gel is subsequently dried and partially densified, the frame will be configured to have desired dimensions without the need for machining.

In more detailed features of the method of the invention, the step of partially densifying comprises partially densifying the dry gel at a prescribed partial densification temperature in an atmosphere comprising helium, nitrogen, oxygen, or mixtures thereof. This partial densification is carried out at a temperature that preferably is within a range of 650° C. to 1260° C., more preferably is within a range of 1100° C. to 1200° C., and most preferably is at about 1180° C. Further, partial densification is carried out by heating the dry gel to the prescribed partial densification temperature at a rate preferably between 1° C./hr and 200° C./hr, more preferably between 10° C./hr and 100° C./hr, and most preferably about 15° C./hr. Further, partial densification includes maintaining the dry gel at the prescribed partial densification temperature preferably for a duration in a range of 1 hour to 100 hours, more preferably for a duration in a range of 1 hour to 30 hours, and most preferably for a duration of about 4 hours.

In other more detailed features of the method of the invention, the step of partially densifying is carried out in an atmosphere consisting essentially of a mixture of oxygen and nitrogen or helium, the mixture having an oxygen concentration between 3% and 20%. More preferably, the atmosphere consists essentially of a mixture of oxygen and nitrogen or helium, the mixture having an oxygen concentration of about 7%.

In other, optional features of the invention, the method can further include steps of removing hydrocarbons from the dry gel by heating the dry gel at a temperature between 150° C. and 300° C., and halogenating the dry gel using a halogenation agent at a temperature between 650° C. and 1,200° C., after the step of removing hydrocarbons. Further, the method can further include steps of oxygenating the dry gel after the step of halogenating, and then re-halogenating the dry gel after the step of oxygenating.

In yet other more detailed features of the invention, the step of partially densifying the dry gel can further include: (1) partially densifying the dry gel at a prescribed initial partial densification temperature, (2) machining the partially densified dry gel to a desired porous frame shape, and (3) partially densifying the porous frame at a prescribed final partial densification temperature, wherein the final partial densification temperature is greater than the initial partial densification temperature by between about 50° C. and about 300° C. The prescribed final partial densification temperature preferably is in a range of 650° C. and 1,260° C., more preferably is in a range of 1,100° C. and 1,200° C., and most preferably is about 1,180° C.

In yet other more detailed features of the invention, the step of partially densifying the dry gel include: (1) partially densifying the dry gel at the prescribed initial partial densification temperature, (2) machining the partially densified dry gel after the step of partially densifying the dry gel, to produce a desired porous frame shape, (3) annealing the machined dry gel, at an annealing temperature that ranges between the initial partial densification temperature and about 300° C. lower than the initial partial densification temperature, and (4) partially densifying the annealed dry gel at a prescribed final partial densification temperature, wherein the final partial densification temperature is higher than the initial partial densification temperature by between about 50° C. and about 300° C.

The preferred method of the invention, for making a porous silica frame suitable for use in a photomask assembly, includes steps of: (1) preparing a dry gel comprising more than 99.9% silica, using a sol-gel method, (2) halogenating the dry gel by heating the gel from about 650° C. to about 1,050° C., at a heating rate of about 25° C./hr in an atmosphere of about 33% chlorine and about 67% helium, and maintaining the dry gel at about 1,050° C., for a duration of about 1 hour in the atmosphere, (3) partially densifying the halogenated dry gel by heating the halogenated dry gel from about 1,050° C. to about 1,180° C., at a heating rate of about 25° C./hr in an atmosphere of about 7% oxygen and about 93% helium, and maintaining the halogenated dry gel at about 1,180° C. for about 4 hours, and (4) machining the partially densified dry gel into a desired frame shape having a flatness of less than 1 micrometer.

Other features and advantages of the present invention should become apparent from the following description of the preferred embodiments and methods, taken in conjunction with the accompanying drawings, which illustrate, by way of example, the principles of the invention.

DESCRIPTION OF THE PREFERRED EMBODIMENTS

Figure 1:
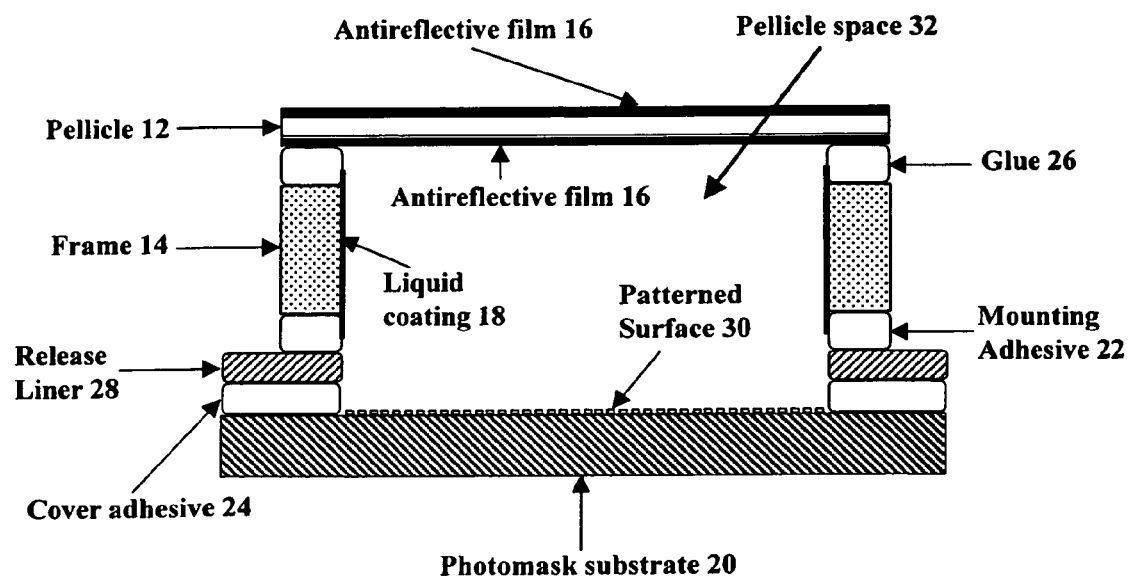
FIG. 1 is an elevational view of a prior art photomask assembly.

The present invention relates to a photomask assembly incorporating a porous frame and to processes for making such a frame. Porous frames embodying the invention should meet multiple physical specifications, including gas permeability, average pore size, coefficient of thermal expansion (CTE), surface flatness, mechanical strength, inner surface area, and scavenging capability.

The porous frame should have high gas permeability, to allow the pellicle space to be purged with an inert gas such as nitrogen within a reasonable processing time period, to partially or completely remove any harmful chemicals present. These chemicals can be present in the pellicle space either because they are generated within the space or because they have diffused into the space. These chemicals include water vapor, oxygen, volatile hydrocarbons, ammonia, carbon dioxide, and sulfuric acid. To remove the chemicals, the permeability of the porous frame to nitrogen or oxygen preferably is higher than 10 ml.mm/$cm^2$.min.MPa, more preferably is higher than 40 ml.mm/$cm^2$.min.MPa, and most preferably is higher than 70 ml.mm/$cm^2$.min.MPa. This high gas permeability can be achieved by configuring the frame to include pores having average pore sizes larger than 0.001 micrometer, more preferably larger than 0.01 micrometer, and most preferably larger than 0.08 micrometer. To prevent particles present in the environment surrounding the photomask assembly from migrating into the pellicle space, the average pore size of the frame preferably is less than 10 micrometers and most preferably is less than 1 micrometer. Thus, the average pore size of the frame preferably is in the range of 0.001 micrometer to 10 micrometers, more preferably is in the range of 0.01 micrometer and 1 micrometer, and most preferably is in the range of 0.08 micrometer to 1 micrometer.

The CTE of the porous frame should closely match that of the photomask substrate and/or that of an overlying hard pellicle, to minimize distortion of the pattern on the photomask substrate and the pellicle caused by heating of the assembly during the manufacturing of electronic chips. The CTE of the frame preferably is in the range of 0.01 ppm/° C. to 10 ppm/° C., more preferably is in the range of 0.1 ppm/° C. to 1 ppm/° C., and most preferably is in the range of 0.3 ppm/° C. to 0.7 ppm/° C. The most preferable material for the porous frame is a material having a CTE value that closely matches that of the photomask substrate and/or the hard pellicle, with a difference of ±20%.

It should be possible to machine the porous frame to a level of flatness that minimizes the optical distortions that might be caused by misalignment of the hard pellicle with respect to the patterns on the photomask substrate. To obtain proper alignment, the porous frame should be machined to have flatness preferably less than 20 micrometers, more preferably less than 5 micrometers, and most preferably less than 1 micrometer.

The porous frame should have sufficient fracture strength to withstand manual handling or stresses that might arise during the frame's preparation, including its processing and incorporation into the photomask assembly, and during the manufacturing of the electronic chip. To achieve this requisite strength, the elastic modulus of the porous frame preferably is higher than 1 GPa, more preferably is higher than 5 GPa, and most preferably is higher than 10 GPa, and the modulus of rupture of the porous frame preferably is higher than 1 MPa, more preferably is higher than 5 MPa, and most preferably is higher than 10 MPa.

In addition, the porous frame should be able to scavenge any harmful chemicals from the pellicle space that might be present during preparation of the photomask assembly and/or generated during the preparation of the electronic chip. Such scavenging ability further reduces the number of potential defects in the photomask substrate caused by harmful chemicals. To achieve this scavenging, the inner surface of the porous frame has a surface area preferably larger than 10 $m^2$/g, more preferably larger than 25 $m^2$/g, and most preferably larger than 70 $m^2$/g. In addition, the porous frame preferably is made of a material that can chemically and/or physically adsorb, or react with, one or more of the harmful chemicals identified above. The porous frame preferably can scavenge harmful chemicals present in an amount preferably higher than an amount equivalent to 0.01 weight percent of its own weight, and most preferably higher than an amount equivalent to 0.05 weight percent of its own weight.

Above requirements can be fulfilled by preparing the porous frames using glass and/or ceramic articles made of silica ($SiO_2$), fluorinated silica, zirconia ($ZrO_2$), alumina ($Al_2O_3$), $SiO_2$—$Al_2O_3$, $SiO_2$—$B_2O_3$, and mixtures thereof. The porous frame is prepared most preferably from silica or fluorinated silica articles having a purity above 96 weight percent silica, because the CTE of these materials closely matches that of silica photomask substrates, fluorinated silica photomask substrates, silica pellicles, and fluorinated silica pellicles.

One example of a suitable porous frame material is commercially available porous glass, having a composition of about 96 weight percent silica, sold by Corning Inc., of New York, under the trademark Vycor® 7930. This glass has pores having an average size of 0.004 micrometer, and it has a CTE of 0.75 ppm/° C. This porous glass has a large inner surface area of 250 $m^2$/g and thereby can effectively scavenge both water vapor and hydrocarbons from the pellicle space. The modulus of rupture of the porous glass is 41.4 MPa. However, this porous glass contains impurities, particularly Na, and also its CTE is higher than that of more than 99.9% pure synthetic silica. This porous glass can be used to manufacture porous frames for the photomask assemblies having less stringent material purity and CTE requirements, and it therefore is considered within the scope of this invention.

The porous frames can be prepared by cutting the porous articles using suitable machining processes, including laser machining, water jet machining, and, most preferably, diamond tool machining and ultrasonic milling. The porous articles can be cut directly into a frame shape as one piece. The frame also can be manufactured by cutting the porous articles into thin rectangular bars and then attaching the bars together using adhesives suitable for the photomask assemblies or using laser welding. After these initial machining steps, the frames can be further machined and polished to meet the dimensional and flatness specifications of the photomask assembly industry.

The porous articles can be manufactured by variety of processes known to the industry. Exemplary processes are described in the following publications: Kingery et al., "Introduction to Ceramics," (John Wiley and Sons, 1976); King, "Ceramic Technology and Processing," (Noyes Publications, 2002); Murata, "Handbook of Optical Fibers and Cables," (Marcel Dekker, 1996); and Brinker et al., "Sol-Gel Science," (Academic Press, 1990). These processes include hand shaping, compacting, uniaxial pressing, hot pressing, hot isostatic pressing (HIP), injection molding, slip casting, tape casting, transfer molding, extrusion, chemical vapor deposition, and sol-gel. In an alternative process, Vycor® 7930 glass is prepared by etching a multicomponent glass, to increase the silica content of the glass to 96% and to cause the formation of pores having an average size of 0.004 micrometer.

These processes also can use high pressures and temperatures to compact powders and slurries. In these processes, dry or slightly damp powders, slurries, or colloidal solutions can be shaped into a plate, a rod, or a frame using a suitable mold or die. The articles thereby obtained may be dried, to remove volatile species such as water, alcohol, and acids used in their preparation. These articles also can be fired, to remove binders or additives used in their preparation. The firing also increases the mechanical strength of the article. The porous articles can be cut into the frame or rectangular rod shape at any step of these processes.

Sol-gel is a preferred process for preparing the porous frames, because of the process's flexibility in obtaining very high purity porous articles having controllable permeability and controllable pore structure at a wide pore size and inner surface area range, and further having desired mechanical properties. In a preferred sol-gel process, a sol is prepared using hydrolyzed silicon alkoxide and fine silica particles (fumed silica, e.g. Aerosil OX-50 manufactured by Degussa Co.), as described in published U.S. Patent Application 2002/0157419 A1 to Ganguli et. al., which is incorporated by reference. The wet gel obtained by gelation of this sol then is dried using a sub-critical drying process described in U.S. Pat. No. 5,473,826 to Kirkbir et. al. This drying process minimizes shrinkage of the gel and decrease of pore size, and it also prevents cracking of the wet gel, which otherwise can occur during drying. Because the gel does not significantly shrink during drying, large crack-free monolithic porous articles having specified pore structures can be easily obtained.

The dried gel then is partially densified at a temperature ranging between 650° C. to 1,260° C., more preferably between 1100° C. and 1,200° C., and most preferably at about 1,180° C. in a controlled atmosphere of helium, nitrogen, oxygen, and their mixtures. Preferably, this atmosphere is a mixture of oxygen with either nitrogen or helium, the mixture having an oxygen concentration preferably between 3% and 20%, and most preferably about 7%. The gel is heated to a partial densification temperature preferably at a rate between 1° C./hr and 200° C./hr. The heating rate is more preferably between 10° C./hr and 100° C./hr, and most preferably about 15° C./hr. The gel is held at this temperature for duration sufficient to provide sufficient strength and develop a desired pore structure, as discussed below.

The method of the present invention can further include a hydrocarbon burnout step, optionally performed after the drying step, in which hydrocarbons and moisture adsorbed on the dry gel surface are removed by heating the dry gel to a temperature between 150° C. and 300° C., and more preferably between 170° C. and 250° C., in a controlled atmosphere of oxygen and nitrogen. This atmosphere preferably contains 3% to 20% oxygen, and most preferably about 7% oxygen. The gel is heated to a hydrocarbon burnout temperature at a rate between 1° C./hr and 200° C./hr. More preferably, the heating rate is between 10° C./hr and 100° C./hr, and most preferably it is about 25° C./hr. The dwell time at the hydrocarbon burnout temperature is between 0.25 hour and 48 hours. Preferably, the dwell time is between 2 hours and 24 hours, and most preferably it is about 12 hours. The dry gel then is partially densified at a temperature ranging between 650° C. and 1,260° C., more preferably between 1100° C. and 1,200° C., and most preferably at about 1,180° C., in a controlled atmosphere of helium, oxygen, nitrogen, or mixtures of such gases. This atmosphere preferably is a mixture of oxygen and either nitrogen or helium, the mixture having an oxygen concentration between 3% and 20%, and most preferably about 7%. The gel is held at this temperature for a duration sufficient to provide a desired strength and to develop a desired pore structure, as discussed below.

The method of the present invention can further include a halogenation step, optionally performed after the steps of drying and hydrocarbon burnout described above, in which the gel is heated over a range of temperatures between 500° C. and 1,200° C., more preferably between 650° C. and 1,050° C., and most preferably between 650° C. and 950° C. During the halogenation step, a heating rate of between 10° C./hr and 200° C./hr, and most preferably about 25° C./hr, is used. Preferably, the gel is held at the halogenation temperature for duration of about 1 hour. The halogenation preferably is carried out at atmospheric pressure using a mixture of a halogenation agent and an inert gas, such as helium or nitrogen. Examples of suitable halogenation agents are chlorine ($Cl_2$), thionyl chloride ($SOCl_2$), carbon tetrachloride ($CCl_4$), fluorine ($F_2$), silicon tetrafluoride ($SiF_4$), carbon ietrafluoride ($CF_4$), nitrogen trifluoride ($NF_3$), sulfur hexafluoride ($SF_6$), hydrochloric acid (HCl), hydrofluoric acid (HF), and mixtures of these agents. Preferred halogenation agents are chlorine, thionyl chloride, and nitrogen trifluoride. The concentration of halogenation agent in the atmosphere preferably is between 0.1% and 100% and most preferably is about 33%. The halogenation process is carried out to remove hydroxyl (OH) ions and other impurities. The dry gel then is partially densified at a temperature ranging between 650° C. and 1,260° C., more preferably between 1100° C. and 1,200° C., and most preferably at about 1,180° C., in a controlled atmosphere of helium, oxygen, nitrogen, or mixtures of such gases. This atmosphere preferably is a mixture of oxygen and either nitrogen or helium, the mixture having an oxygen concentration between 3% and 20%, and most preferably about 7%. The gel is held at this temperature for duration sufficient to provide a desired strength and to develop a desired pore structure, as discussed below.

The method of the present invention can further include a step, optionally performed after the steps of drying, hydrocarbon burnout, and halogenation, described above, in which the halogenated gel is oxygenated using methods known in the art to, remove halogen species remaining in the gel, and it is then re-halogenated. This step helps to remove additional impurities. The dry gel then is partially densified at a temperature ranging between 650° C. and 1,260° C., more preferably between 1100° C. and 1,200° C., and most preferably at about 1,180° C., in a controlled atmosphere of helium, oxygen, nitrogen, or mixtures of such gases. This atmosphere preferably is a mixture of oxygen and either nitrogen or helium, the mixture having an oxygen concentration between 3% and 20%, and most preferably about 7%. The gel is held at this temperature for duration sufficient to provide a desired strength and to develop a desired pore structure, as discussed below.

Figure 2:
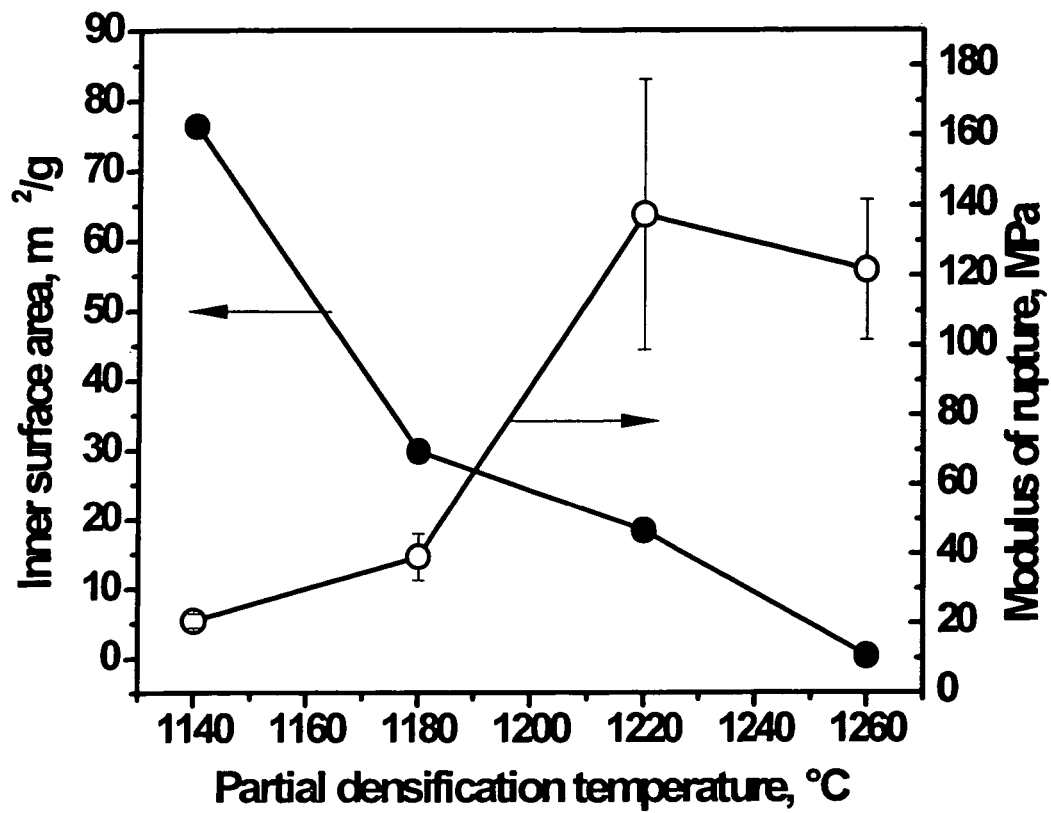
FIG. 2 is a graphical representation of the relationship between partial densification temperature, fracture strength, and inner surface area of dry silica gel articles partially densified at about 1140° C., about 1180° C., about 1220° C., and about 1260° C. for about four hours, prepared using the method of the present invention.
Figure 3:
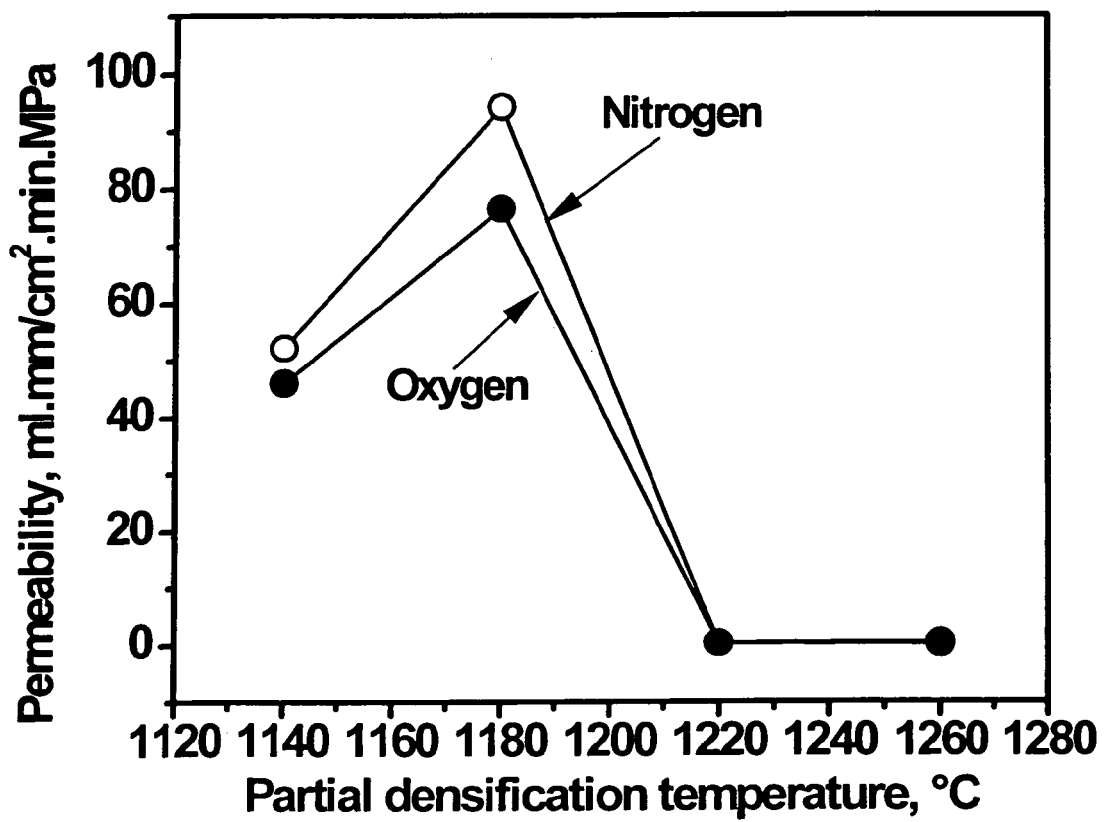
FIG. 3 is a graphical representation of the relationship between partial densification temperature and permeability of dry silica gel articles to nitrogen and oxygen. These articles were partially densified at about 1140° C., about 1180° C., about 1220° C., and about 1260° C. for about four hours, prepared using the method of the present invention.

Based on the particular combination of temperature and time duration for the specified partial densification step, porous silica glasses can be obtained exhibiting either lower strength but larger inner surface area and higher permeability, or higher strength but smaller inner surface area and lower permeability. FIGS. 2 and 3 show, by way of example, the effects of partial densification temperature and time on permeability, inner surface area, and the modulus of rupture. That is, the duration and temperature of the partial densification step are selected to achieve the proper balance of gas permeability and inner surface area with mechanical strength, as required by a given application. In particular, the duration of this partial densification ranges between 5 minutes and 48 hours, more preferably between 1 hour and 30 hours, and most preferably about 4 hours. This provides a porous glass article that is readily machined, but that is not yet brittle.

This porous article then is machined to the appropriate final dimensions of the desired porous photomask frame. The photomask substrates are rectangular in shape, having standard dimensions of 12.5 cm×12.5 cm and 15 cm×15 cm. The substrate thickness varies with application. For future applications, photomask substrates having dimensions of 22.5 cm×22.5 cm size are being targeted. The dimensions of the patterned area of the photomask substrate also vary with application. Thus, the frame's shape and dimensions vary with the sizes of the photomask substrate size and the patterned area. The porous article is machined to fulfill these shape and dimensional requirements, as well as process requirements. The porous article can be machined using conventional processes, such as diamond turning, laser machining, water jet machining, and sonic milling. The porous silica article can be machined to directly provide a frame. The frame also can be prepared by cutting the porous silica article into rectangular bars and then attaching the bars together using suitable adhesives or using laser welding.

In a preferred method of the present invention, the dry gel is partially densified at an initial partial densification temperature, and it then is machined to the porous frame shape. This takes advantage of the potentially easier machining of the less-densified article. Thereafter, this intermediate porous silica article is heated to a final partial densification temperature, to obtain the desired porous frame. The initial partial densification temperature is lower than the final partial densification temperature by between 50° C. and 300° C. The final partial densification temperature preferably ranges between 650° C. and 1,260° C., more preferably ranges between 1,100° C. and 1,200° C., and most preferably is about 1,180° C. The gel is held at this final partial densification temperature for a duration sufficient to provide a desired strength and to develop a desired pore structure, depending on the application, as discussed above.

In a more detailed feature of the method of the invention, the final partial densification step can be preceded by a step of subjecting the dry gel to an annealing temperature that is as much as about 300° C. lower than the initial partial densification temperature. This annealing step removes stresses that might have developed in the article during machining. Finally, the annealed porous silica article is heated to the final partial densification temperature, to produce the desired porous frame. The final partial densification temperature preferably ranges between 650° C. and 1,260° C., and more preferably ranges between 1,100° C. and 1,200° C. The most preferable densification temperature is about 1,180° C. The gel is held at this final partial densification temperature for a duration sufficient to provide a desired strength and to develop a desired pore structure, depending on the application, as discussed above.

In additional aspects of the method of the present invention, the step of machining can be partly or completely avoided if the step of preparing the dry gel incorporates a molding process known in the sol-gel industry as a "net-shaping" or "near-net-shaping" process. These molding processes can be used after experimental determination of the level of shrinkage of the particular gel caused by processing from gelation to partial densification. The gel, formed by gelation of sol, assumes the inner dimensions of the mold. After the level of shrinkage caused by processing has been experimentally determined, the final dimensions of the gel after partial densification can be predicted. In this aspect of the method of the present invention, sols are cast into molds having shapes and inner dimensions determined by the above-described shrinkage experimentation, such that when the gels obtained from such molds are dried and then directly (i.e., without machining or intermediate machining) partially densified, they yield articles having dimensions substantially identical to that required, without the need for the step of machining of the articles.

The method of the present invention can be better understood by way of the following illustrative examples:

EXAMPLE 1

This example illustrates a preferred aspect of the method of the present invention, incorporating partial densification and machining. A sol was prepared using the method disclosed in published U.S. Patent Application 2002/0157419 A1 to Ganguli et. al. This sol was cast into a square mold having inner dimensions of about 26.7 cm×about 26.7 cm, to a height of about 18 mm. After gelation, the gel was subcritically dried according to techniques disclosed in U.S. Pat. No. 5,473,826 to Kirkbir et al. The dried gel was free of any cracks.

To perform partial densification of the dry gel, the gel was placed in an electrically heated SiC furnace having a quartz enclosure. First, hydrocarbons and water vapor adsorbed on the dry gel surface were removed by heating the gel between 20° C. and 250° C., in an atmosphere containing about 7% oxygen and about 93% nitrogen. In this step, the gel was first heated from about 20° C. to about 170° C., at a heating rate of about 25° C./hr, and the gel then was held at about 170° C. for about 5 hours. The gel then was further heated from about 170° C. to about 250° C., at a heating rate of about 5° C./hr. The dry gel then was held at about 250° C. for about 12 hours.

After the hydrocarbon removal step, the dry gel was heated in the same atmosphere, at a rate of about 25° C./hr, to a temperature of about 650° C. The gel was then halogenated by heating it from about 650° C. to about 1,050° C., at the same rate of about 25° C./hr, in an atmosphere of about 33% chlorine and about 67% helium. The gel was held at about 1,050° C. for about 1 hour, for further halogenation. The atmosphere then was changed to be about 7% oxygen and about 93% helium, and the gel was partially densified by heating the gel from about 1,050° C. to about 1,180° C., at a heating rate of about 25° C./hr, and by holding the gel at about 1,180° C. for about 4 hours. The partially densified dry gel then was cooled to room temperature and analyzed to characterize its physical properties.

The pore structure of the partially densified gel was characterized by nitrogen-adsorption equipment, model name Tristar, manufactured by Micromeritics, of Norcross, Ga., U.S.A. The surface area of this dry gel was measured to be 29.8 $m^2/g$, as shown in FIG. 2, and the average pore size was measured to be about 0.2 micrometer. The modulus of rupture of the partially densified gel was measured using a mechanical strength analyzer, Model No. 4202, manufactured by Instron, of Canton, Mass. As shown in FIG. 2, the modulus of rupture was measured to be 39.1±6.7 MPa. The permeability of the partially densified gel was measured using a permeameter, Model No. G(E) 11142002-1135, manufactured by PMI (Porous Materials Inc.), of Ithaca, N.Y. As shown in FIG. 3, the permeability to nitrogen was measured to be about 94.3 ml.mm/$cm^2$.min.MPa, and the permeability to oxygen was measured to be about 76.5 ml.mm/$cm^2$.min.MPa.

Figure 4:
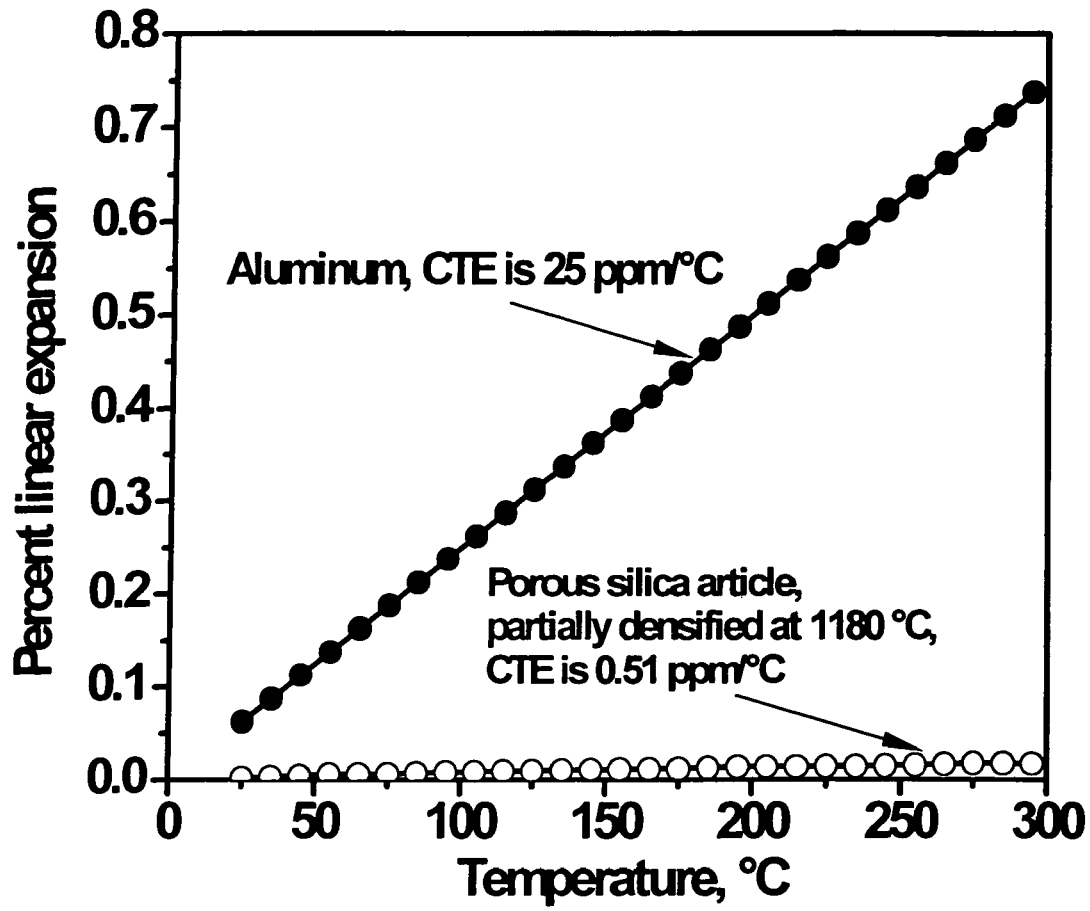
FIG. 4 is a graphical representation of the relationship between partial densification temperature and the coefficient of thermal expansion (CTE) of a dry silica gel article partially densified at about 1180° C. for about four hours, prepared using the method of the present invention and an aluminum article.

The CTEs of both the partially densified gel and an aluminum article were measured over a temperature range of about 20° C. to about 290° C., using a dilatometer, Model No. 1000D, manufactured by Orton, of Westerville, Ohio. As shown in FIG. 4, the CTEs were measured to be about 0.51 ppm/° C. for the porous silica article and about 25 ppm/° C. for the aluminum article. The CTE of a synthetic silica article, marketed by Corning under the trademark 7980, was measured to be about 0.55 ppm/° C., using the same equipment and analysis conditions. These results indicated that the CTE of the porous silica article prepared in this Example is close to that of a silica photomask substrate.

Figure 5:
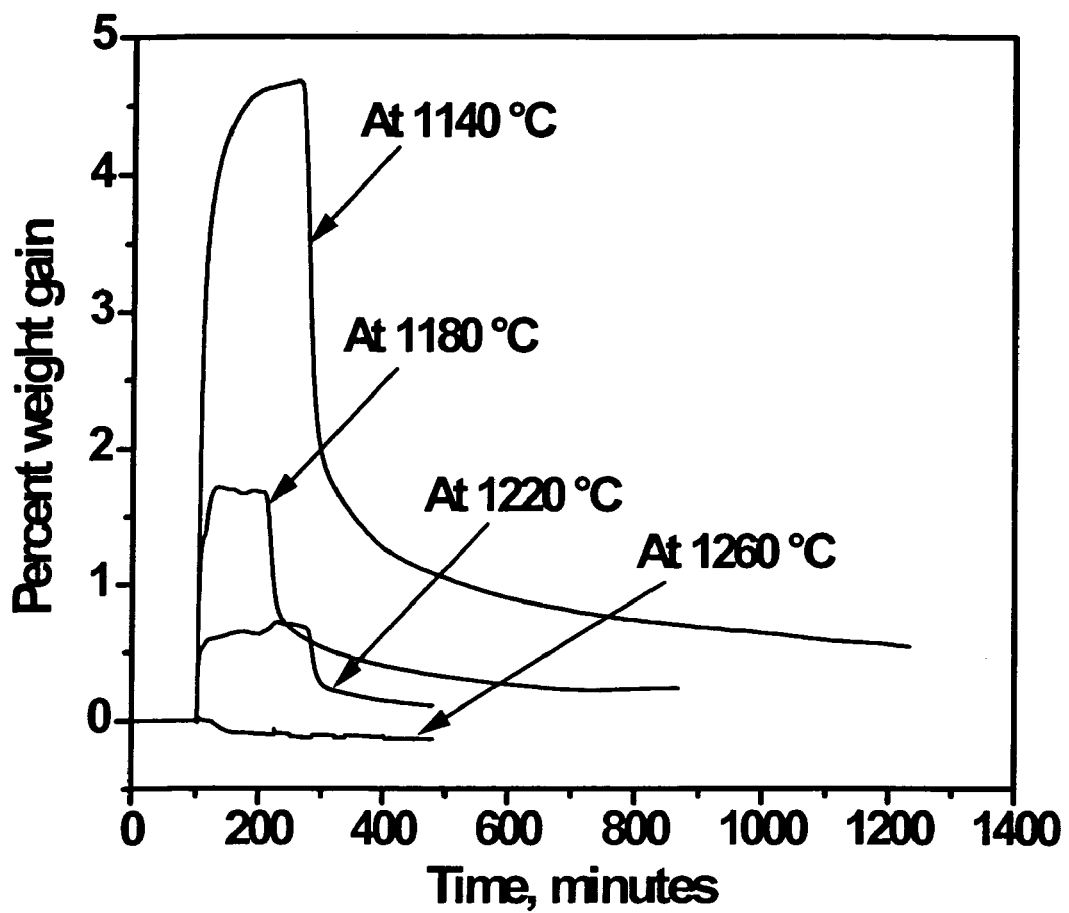
FIG. 5 is a graphical representation of the relationship between partial densification temperature and the ethanol scavenging capability of dry silica gel articles partially densified at about 1140° C., about 1180° C., about 1220° C., and about 1260° C. for about four hours, prepared using the method of the present invention.

The capability of the partially densified gel for scavenging of harmful chemicals was measured at a temperature of about 20° C., using a thermogravimetric analyzer, Model No. 7, manufactured by Perkin Elmer, of Boston, Mass. The results are shown in FIG. 5. In this measurement, dry nitrogen was first passed through a chamber containing the partially densified gel, for about 100 minutes, and this dry nitrogen stream then was moisturized with ethanol by diverting the stream through an ethanol bubbler before its entrance to the chamber. The weight of the partially densified gel increased due to adsorption of ethanol on its surface. This bubbling was stopped after about an additional 100 minutes, by bypassing the ethanol bubbler and again introducing the dry nitrogen to the chamber. This caused partial desorption of the ethanol to the dry nitrogen stream, resulting in a decrease in the weight of the gel. This dry nitrogen flow was continued for about 600 minutes. The amount of weight gain at the end of the measurement was due to amount of ethanol irreversibly adsorbed on the gel surface, indicating that the gel's scavenging capability was about 0.23 weight percent.

The porous plate thereby obtained was machined using a diamond tool machine, Model No. VF-1, manufactured by HAAS, of Oxnard, Calif., to obtain a frame having an inner length of about 14.2 cm and an inner width of about 12.2 cm. The thickness of the frame was about 2 mm.

EXAMPLE 2

A porous frame was prepared and analyzed in the same manner as in Example 1, except that the gel was partially densified by holding it at about 1140° C., instead of about 1180° C. Some of the analytical results are shown in FIGS. 2, 3 and 5. The resulting porous glass had a surface area measured to be about 76.3 $m^2/g$ land had an average pore size measured to be about 0.09 micrometer. Its modulus of rupture was measured to be about 20.7±2.0 MPa. Its permeability to nitrogen was measured to be about 52.2 ml.mm/$cm^2$.min.Mpa, and its permeability to oxygen was measured to be about 46.0 ml.mm/$cm^2$.min.MPa. The CTE of this porous glass was measured to be about 0.71 ppm/° C., and its scavenging capability was measured to be about 0.56 weight percent after about 1000 minutes of desorption.

Taken together, Examples 1 and 2 demonstrate that porous frames having a wide range of pore structure and strength can be prepared by varying the duration of the partial heating. The large surface area gels, like one obtained in Example 2, would be most useful for applications in which high pore surface area is important and somewhat reduced strength is acceptable.

COMPARATIVE EXAMPLE 1

A porous frame was prepared and analyzed in the same manner as in Example 1, except that the gel was partially densified by holding it at about 1220° C., instead of about 1180° C. Some of the analytical results are shown in FIGS. 2, 3 and 5. The resulting porous glass had a surface area measured to be about 18.4 $m^2/g$ and an average pore size measured to be about 0.08 micrometer. It had a modulus of rupture measured to be about 137.5±38.6 MPa, and its permeability to nitrogen was measured to be about 0.3 ml.mm/$cm^2$.min.MPa and its permeability to oxygen was measured to be about 0.4 ml.mm/$cm^2$.min.MPa. The CTE of this porous glass was measured to be about 0.58 ppm/° C., and its scavenging capability was measured to be about 0.12 weight percent after about 250 minutes of desorption.

COMPARATIVE EXAMPLE 2

A porous frame was prepared and analyzed in the same manner as in Example 1, except that the gel was partially densified by holding it at about 1260° C., instead of about 1180° C. Some of the analytical results are shown in FIGS. 2, 3 and 5. The resulting porous glass had a surface area measured to be about 0.3 $m^2/g$ and an average pore size measured to be about 0.03 micrometer. It had a modulus of rupture measured to be about 121.7±20.0 MPa, and its permeability to nitrogen was measured to be about 0.1 ml.mm/$cm^2$.min.MPa and its permeability to oxygen was measured to be about 0.5 ml.min/$cm^2$.min.MPa. The CTE of this porous glass was measured to be about 0.6 ppm/° C., and its scavenging capability was determined to be negligible after about 250 minutes of desorption.

Taken together, Comparative Examples 1 and 2 demonstrate that if the dry gels are partially densified at a temperature of about 1200° C., for longer than about 4 hours, the permeability of the porous article decreases to an unacceptable level, at which the purging of the pellicle space from the harmful chemicals cannot be achieved within a reasonable processing time.

Although the invention has been described in detail with reference only to the preferred articles and methods described above, those of ordinary skill in the art will appreciate that various modifications can be made without departing from the scope of the invention. Examples of such modifications include changes to the porous frame material, permeability, pore size, scavenging capability, and CTE, as well as changes to the steps of hydrocarbon burnout, halogenation, oxygenation, partial densification, and machining.

We claim:

1. A method for making a photomask assembly, comprising:
   providing a photomask substrate, a porous frame, and a pellicle, wherein the porous frame has a gas permeability to oxygen or nitrogen higher than about 10 ml.mm/cm$^2$.min.MPa, an average pore size between 0.001 micrometer and 10 micrometers, and a coefficient of thermal expansion between 0.01 ppm/°C. and 10 ppm/°C.; and
   attaching together the photomask substrate, the porous frame, and the pellicle, to form a photomask assembly.

2. A method as defined in claim 1, wherein providing a porous frame comprises: (a) preparing a gel by a sol-gel process, (b) drying the gel, and (c) partially densifying the dry gel.

3. A method as defined in claim 2, and further comprising machining the densified dry gel to form the porous frame.

4. A method as defined in claim 2, and further comprising machining the densified dry gel to form rectangular bars and welding the bars to form the porous frame.

5. A method as defined in claim 2, and further comprising machining the densified dry gel using a process selected from the group consisting of diamond tool machining, ultrasonic milling, laser machining, and water jet machining.

6. A method as defined in claim 2, and further comprising machining the densified dry gel using a process selected from the group consisting of diamond tool machining and ultrasonic milling.

7. A method as defined in claim 2, wherein preparing a gel comprises shaping the gel in a mold having dimensions such that when the gel is subsequently dried and partially densified, the frame will be configured to have desired dimensions without the need for machining.

8. A method as defined in claim 2, and further comprising machining the densified dry gel to less than 20-micrometer surface flatness.

9. A method as defined in claim 2, wherein the dry gel comprises silica.

10. A method as defined in claim 2, wherein the gel comprises silicon alkoxide and fumed silica.

11. A method as defined in claim 2, wherein partially densifying comprises partially densifying the dry gel at a prescribed partial densification temperature in an atmosphere comprising helium, nitrogen, oxygen, or mixtures thereof.

12. A method as defined in claim 11, wherein partially densifying occurs at a partial densification temperature within a range of 650° C. to 1260° C.

13. A method as defined in claim 11, wherein partially densifying occurs at a partial densification temperature within a range of 1100° C. to 1200° C.

14. A method as defined in claim 11, wherein partially densifying occurs at a partial densification temperature of about 1180° C.

15. A method as defined in claim 11, wherein partially densifying comprises heating the dry gel to the prescribed partial densification temperature at a rate between 1° C./hr and 200° C./hr.

16. A method as defined in claim 11, wherein partially densifying comprises heating the dry gel to the prescribed partial densification temperature at a rate between 10° C./hr and 100° C./hr.

17. A method as defined in claim 11, wherein partially densifying comprises heating the dry gel to the prescribed partial densification temperature at a rate of about 15° C./hr.

18. A method as defined in claim 11, wherein partially densifying comprises maintaining the dry gel at the prescribed partial densification temperature for a duration in a range of 1 hour to 100 hours.

19. A method as defined in claim 11, wherein partially densifying comprises maintaining the dry gel at the prescribed partial densification temperature for a duration in a range of 1 hour to 30 hours.

20. A method as defined in claim 11, wherein partially densifying comprises maintaining the dry gel at the prescribed partial densification temperature for a duration of about 4 hours.

21. A method as defined in claim 11, wherein the atmosphere consists essentially of a mixture of oxygen and nitrogen or helium, the mixture having an oxygen concentration between 3% and 20%.

22. A method as defined in claim 11, wherein the atmosphere consists essentially of a mixture of oxygen and nitrogen or helium, the mixture having an oxygen concentration of about 7%.

23. A method as defined in claim 2, and further comprising removing hydrocarbons from the dry gel by heating the dry gel at a temperature between 150° C. and 300° C.

24. A method as defined in claim 23, and further comprising halogenating the dry gel using a halogenation agent at a temperature between 650° C. and 1,200° C., after the step of removing hydrocarbons.

25. A method as defined in claim 24, and further comprising: (a) oxygenating the dry gel after the step of halogenating, and (b) re-halogenating the dry gel after the step of oxygenating.

26. A method as defined in claim 2, wherein the step of partially densifying the dry gel further comprises:
   partially densifying the dry gel at a prescribed initial partial densification temperature;
   machining the partially densified dry gel to a desired porous frame shape; and
   partially densifying the porous frame at a prescribed final partial densification temperature, wherein the final partial densification temperature is greater than the initial partial densification temperature by between about 50° C. and about 300° C.

27. A method as defined in claim 26, wherein the prescribed final partial densification temperature is in a range of 650° C. and 1,260° C.

28. A method as defined in claim 26, wherein the prescribed final partial densification temperature is in a range of 1,100° C. and 1,200° C.

29. A method as defined in claim 26, wherein the prescribed final partial densification temperature is about 1,180° C.

30. A method as defined in claim 26, wherein partially densifying the dry gel comprises:
   partially densifying the dry gel at the prescribed initial partial densification temperature;
   machining the partially densified dry gel after the step of partially densifying the dry gel, to produce a desired porous frame shape;
   annealing the machined dry gel, at an annealing temperature that ranges between the initial partial densification temperature and about 300° C. lower than the initial partial densification temperature; and partially densifying the annealed dry gel at a prescribed final partial densification temperature, wherein the final partial densification temperature is higher than the initial partial densification temperature by between about 50° C. and about 300° C.

31. A method as defined in claim 1, and further comprising a method for forming the porous frame, comprising:

preparing a dry gel comprising more than 99.9% silica, using a sol-gel method;

halogenating the dry gel by heating the dry gel from about 650° C. to about 1,050° C., at a heating rate of about 25° C./hr in an atmosphere of about 33% chlorine and about 67% helium, and maintaining the dry gel at about 1,050° C., for a duration of about 1 hour in the atmosphere;

partially densifying the halogenated dry gel by heating the halogenated dry gel from about 1,050° C. to about 1,180° C., at a heating rate of about 25° C./hr in an atmosphere of about 7% oxygen and about 93% helium, and maintaining the halogenated dry gel at about 1,180° C. for about 4 hours; and machining the partially densified dry gel into a desired frame shape having a flatness of less than 1 micrometer.

* * * * *